(12) United States Patent
Takeuchi et al.

(10) Patent No.: US 7,077,305 B1
(45) Date of Patent: Jul. 18, 2006

(54) BALL LOADING APPARATUS

(75) Inventors: Masao Takeuchi, Suwa (JP); Yoshiharu Fujimori, Suwa (JP); Chuji Tomita, Suwa (JP)

(73) Assignee: Athlete Fa Corporation, Nagano (JP)

( * ) Notice: Subject to any disclaimer, the term of this patent is extended or adjusted under 35 U.S.C. 154(b) by 0 days.

(21) Appl. No.: 09/602,814

(22) Filed: Jun. 23, 2000

(30) Foreign Application Priority Data

Jun. 24, 1999 (JP) .................................. 11-178578
Jun. 9, 2000 (JP) ............................. 2000-173195

(51) Int. Cl.
B23K 3/00 (2006.01)
B23K 1/00 (2006.01)

(52) U.S. Cl. ........................................ 228/41; 228/246

(58) Field of Classification Search ................ 228/245, 228/246, 33, 41
See application file for complete search history.

(56) References Cited

U.S. PATENT DOCUMENTS

| | | | | |
|---|---|---|---|---|
| 5,284,287 A | * | 2/1994 | Wilson et al. ............ | 228/180.2 |
| 5,467,913 A | * | 11/1995 | Namekawa et al. .......... | 228/41 |
| 5,615,823 A | | 4/1997 | Noda et al. ................ | 228/103 |
| 5,626,277 A | * | 5/1997 | Kawada ...................... | 228/41 |
| 5,655,704 A | * | 8/1997 | Sakemi et al. .............. | 228/246 |
| 5,657,528 A | * | 8/1997 | Sakemi et al. ................ | 29/430 |
| 5,768,755 A | | 6/1998 | Hemmerich .................. | 26/93 |
| 5,768,775 A | * | 6/1998 | Nakazato ..................... | 29/843 |
| 5,867,260 A | * | 2/1999 | Sakai ........................ | 356/237 |
| 5,890,283 A | * | 4/1999 | Sakemi et al. ................ | 29/840 |
| 6,099,681 A | * | 8/2000 | Arikado et al. ............. | 156/285 |
| 6,186,389 B1 | * | 2/2001 | Nakajima et al. ............. | 228/41 |

FOREIGN PATENT DOCUMENTS

| | | | |
|---|---|---|---|
| JP | 08-064944 | | 3/1986 |
| JP | 5-129374 | * | 5/1993 |
| JP | 07-307344 | | 11/1995 |
| JP | 08-018209 | | 1/1996 |
| JP | 08-097218 | | 4/1996 |
| JP | 8-107121 | * | 4/1996 |
| JP | 08-107121 | | 4/1996 |
| JP | 08-112671 | | 5/1996 |
| JP | 08-115917 | | 5/1996 |
| JP | 8-115942 | * | 5/1996 |
| JP | 08-115942 | | 5/1996 |
| JP | 08-118005 | | 5/1996 |
| JP | 08-139093 | | 5/1996 |
| JP | 08-153958 | | 6/1996 |
| JP | 08-153959 | | 6/1996 |
| JP | 08-153960 | | 6/1996 |
| JP | 08-206825 | | 8/1996 |
| JP | 08-296824 | | 11/1996 |
| JP | 08-307046 | | 11/1996 |
| JP | 09-018129 | | 1/1997 |
| JP | 9-018129 | * | 1/1997 |
| JP | 09-064048 | | 3/1997 |

(Continued)

*Primary Examiner*—Kevin P. Kerns
(74) *Attorney, Agent, or Firm*—Hogan & Hartson LLP

(57) ABSTRACT

A ball mounting apparatus for mounting a plurality of balls sucked up and held by a head onto a workpiece. The apparatus includes a positioning mechanism for the workpiece, a ball supply device for supplying the balls, the head for sucking up the balls, an force generating device for urging the head upward, a clamping device for clamping the head in a condition in which this force generating device stores the force, and a moving mechanism for moving the head. The force of the force generating device is able to lift the head above a lower stop which is a component of the clamping device.

4 Claims, 10 Drawing Sheets

FOREIGN PATENT DOCUMENTS

| | | |
|---|---|---|
| JP | 09-064100 | 3/1997 |
| JP | 09-064102 | 3/1997 |
| JP | 09-064151 | 3/1997 |
| JP | 09-129668 | 5/1997 |
| JP | 09-129678 | 5/1997 |
| JP | 09-223713 | 8/1997 |
| JP | 09-232799 | 9/1997 |
| JP | 09-246422 | 9/1997 |
| JP | 09-260387 | 10/1997 |
| JP | 09-270442 | 10/1997 |
| JP | 09-293756 | 11/1997 |
| JP | 10-041341 | 2/1998 |
| JP | 10-041342 | 2/1998 |
| JP | 10-041352 | 2/1998 |
| JP | 10-050712 | 2/1998 |
| JP | 10-056038 | 2/1998 |
| JP | 10-058241 | 3/1998 |
| JP | 10-058250 | 3/1998 |
| JP | 10-064957 | 3/1998 |
| JP | 10-084180 | 3/1998 |
| JP | 10-092866 | 4/1998 |
| JP | 10-145095 | 5/1998 |
| JP | 10-163616 | 6/1998 |
| JP | 10-200249 | 7/1998 |
| JP | 10-209195 | 8/1998 |
| JP | 10-229089 | 8/1998 |
| JP | 10-242209 | 9/1998 |
| JP | 10-261675 | 9/1998 |
| JP | 10-284528 | 10/1998 |
| JP | 10-294338 | 11/1998 |
| JP | 10-303250 | 11/1998 |
| JP | 11-000836 | 1/1999 |
| JP | 11-003903 | 1/1999 |
| JP | 11-017324 * | 1/1999 |
| JP | 11-054897 | 2/1999 |
| JP | 11-087389 | 3/1999 |
| JP | 11-243103 * | 9/1999 |
| JP | 2001-071218 * | 3/2001 |

* cited by examiner

BALL LOADING APPARATUS

BACKGROUND OF THE INVENTION

1. Field of the Invention

The present invention relates to a ball mounting apparatus and ball mounting method for sucking up balls, which are used when an integrated circuit is mounted on a substrate or a substrate-mounted integrated circuits is mounted on other large substrate, for holding the balls on a ball transfer member which is called a head, and mounting the balls on a workpiece.

2. Description of the Related Art

In conventional ball mounting apparatus and methods, various counterbalance mechanisms for heads have been devised to avoid the application of excessive loads to balls by a head when the head mounts the balls onto workpieces such as semiconductor integrated circuits, circuit boards and so on. Such apparatus and methods are described in U.S. Pat. No. 5,768,775 and Japanese Patent Application Laid-Open Hei 9-18129. The apparatus described in U.S. Pat. No. 5,768,775 uses a spring force that cancels a self-weight of the head, but the device has the disadvantage that vibration occurs when the head moves at medium or high speeds because the head is not damped.

In the apparatus and method described in Hei 9-18129, a head weight is not counterbalanced by a spring tension force, but instead by a lifting force of a cylinder. In the case of counterbalancing the head weight, there are hence two disadvantages with the apparatus and method described above. First, it is difficult to position the head at a predetermined position in a counterbalanced condition. Second, upon moving, a clamping force of the head is weak since the head is fixed only by the self-weight of the head. The first disadvantage of the techniques described in Hei 9-18129 is as follows. If the lifting force of the cylinder is even slightly stronger than a total weight of the head and elements moving with the head (hereafter "head weight"), the head rises to stop at an upper moving limit of the cylinder. On the other hand, if the lifting force of the cylinder is weaker than the head weight, the head drops to stop at a lower moving limit of the cylinder. Only where the lifting force of the cylinder is equal to the head weight, does the head stop in a counterbalanced condition. But, even in the counterbalanced condition, the head moves some distance until a velocity of the head damps due to friction of the cylinder. That is to say, a stop position of the head is not definite. In this manner, the apparatus which uses a cylinder for a balancer has a serious disadvantage. The second disadvantage is as follows. In the case where the head quickly stops when raising or lowering, the head vibrates up and down whether the head weight is heavy or light, because the head is fixed only by the self-weight of the head. The vibration does not cease until the vibration is damped by friction of the cylinder. Only when moving the head in a quasi-static state can avoid vibration be avoided, which is not practical. As mentioned above, a serious disadvantage, in practical use, belongs to an apparatus of which the head is clamped only by the self-weight of the head.

SUMMARY OF THE INVENTION

Accordingly, the present invention is directed to a counterbalance type ball mounting apparatus and method in which the head weight is counterbalanced that substantially obviates one or more of the problems due to imitations and disadvantages of the related art.

An object of the present invention is to provide an apparatus and method which prevent vibration from occurring when the head moves and also easily achieves a high degree of positioning accuracy.

To achieve these and other advantages and in accordance with the purpose of the present invention, as embodied and broadly described, the present invention provides an apparatus comprising a positioning mechanism for positioning the workpiece, a ball supply device for supplying balls, a head for sucking up and holding the balls, a force generating device for urging the head in an upward direction, a clamping device for clamping the head) and a moving mechanism for moving the head.

A spring member for the force generating device may be designed to provide a force to lift the head above a lower position limiter, or stop. The clamping device also may include a cylinder and a lower stop. Moreover, suction pads which fix the workpiece to a holding table may be provided in the form of bellows-shaped pads.

In another aspect, the present invention provides a ball mounting method characterized by counterbalancing the head weight and the force of the force generating device so that a net force is substantially zero by releasing a pressure of the cylinder as needed. More specifically, the ball mounting method of the present invention includes sequential steps of lowering a clamped head toward a ball supply section, sucking up the balls to the head from the ball supply section, moving the head to above the workpiece, releasing a clamping force clamping the head to a lower stop, mounting the balls held by the head on the workpiece, clamping the head, and moving the head above the ball supply section.

In the step of clamping the head to the lower stop, the clamping force may be in the range of 2 to 30 Kgf. In the step of sucking up the balls to the head, the balls may occupy 5% to 80% of a bottom area of the container. In the step of sucking up the balls to the head, the head may suck up the balls again after temporarily stopping sucking up the balls to disperse aggregated balls. Further, the ball mounting method of the present invention may include the steps of counterbalancing the head weight substantially to zero, lowering the tip of each of the balls to a bottom of a flux layer, and applying the flux to the balls. Furthermore, the mounting method of the present invention may include a step of applying a conductive adhesive to the balls after sucking up conductive balls to the head. In the step of mounting the balls sucked up to the head on the workpiece, a force for clamping the head to the lower stop with a pressure of the cylinder may be less than or equal to 1 Kgf. The ball mounting method of the present invention may include a step of striking the head with a hammer such that extra balls remained on the head are dropped, after the step of mounting the balls on the workpiece.

Additional features and advantages of the invention will be set forth in the descriptions that follow and in part will be apparent from the description, or may be learned by practice of the invention. The objectives and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The embodiments of the present invention will be explained with reference to the accompanying drawings, in which:

FIG. 2(A) shows the balls piled in several layers, and FIG. 2(B) shows the balls scattered sparsely.

FIG. 3(A) is a plan view of the holding table with bellows-shaped suction pads, and FIG. 3(B) is a cross-sectional view thereof.

FIG. 10(A) is a front view, and FIG. 10(B) is a plan view showing the head and indicating positions where the single-acting cylinders for imparting vibrations strike the head.

DETAILED DESCRIPTION OF THE PREFERRED EMBODIMENTS

Figure 1:
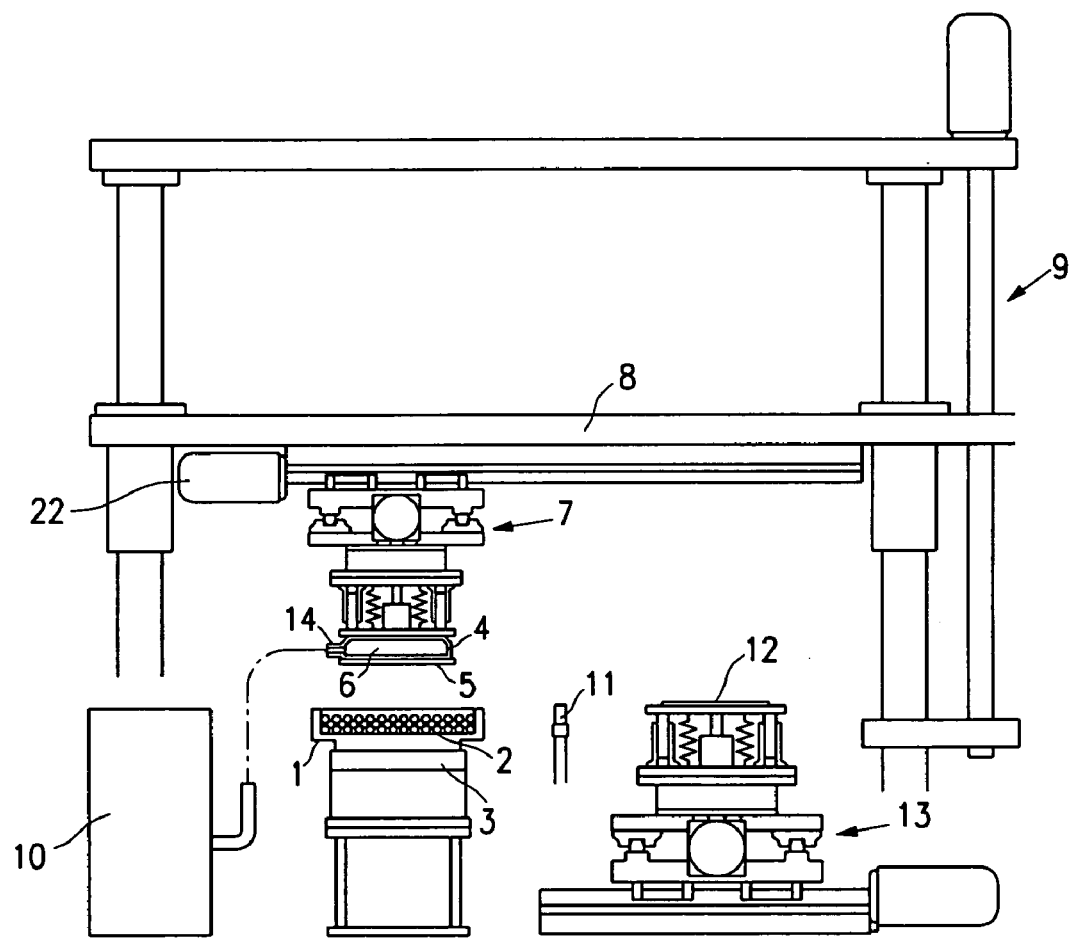
FIG. 1 is a front view showing a ball mounting apparatus according to an embodiment of the present invention.

FIG. 1 is a front view showing an overall structure of a ball mounting apparatus according to an embodiment of the present invention. Numeral 1 denotes a ball supply section. Numeral 2 denotes a ball. Numeral 3 denotes a vibrator that imparts vibration to the balls. Numeral 4 denotes a head. Numeral 5 denotes a head bottom wherein a plurality of suction holes 25 for vacuum-absorbing the balls 2 (see FIG. 4) are machined. Numeral 6 denotes a cavity of the head 4. Numeral 7 denotes a XYZθ table 7 for positioning the head 4. Numeral 8 denotes a base on which the head's XYZθ table moves. Numeral 9 denotes a Z-direction drive unit that moves the base 8 in the Z-direction. Numeral 10 denotes a vacuum pump that reduces the pressure inside the cavity 6 of the head 4 and a holding table 23 for the workpiece 12 (see FIG. 3). Numeral 11 denotes a line light source for inspecting suction errors. Numeral 12 denotes a workpiece on which the balls 2 are mounted. Numeral 13 denotes a XYZθ table for the workpiece. Numeral 14 denotes a case. Numeral 22 denotes an X-direction drive unit which moves the head's XYZθ table 7 in the X-direction.

One or more of the following sensors is disposed in the cavity to detect ball pickup errors—light detecting sensors, a sound detecting sensor, a pressure gage sensor, or an air flow rate sensor. This embodiment uses light detecting sensors. When the head 4 passes above the line light source, the light detecting sensors detect light leaking through any of the suction holes 25 have not sucked up balls, thereby determining the presence of suction errors. The sound detecting sensor detects sound generated when air is sucked through the suction hole 25, thereby determining that the balls 2 are picked up in all the suction holes 25 when the suction sound is not detected. Since a pressure in the cavity 6 is rapidly reduced when all the suction holes 25 are occluded by balls 2, the pressure gage sensor senses an absorption rate of the balls 2 through a degree of vacuum or a differential coefficient of the degree of vacuum. The air flow sensor is arranged between the cavity 6 and the vacuum pump 10 to measure a gas flow rate into the vacuum pump 10 to determine a suction state of the balls 2.

The ball supply section 1 includes a container for receiving balls 2 from a ball feed device (not shown). The ball feed device may be, for example, a parts feeding machine provided with a mechanism that automatically supplies a predetermined amount of the balls 2 to the container whenever an amount of the balls 2 decreases. The ball supply device of the present invention includes the ball supply section 1, the vibrator 3 and the ball feed device.

Figure 2A:
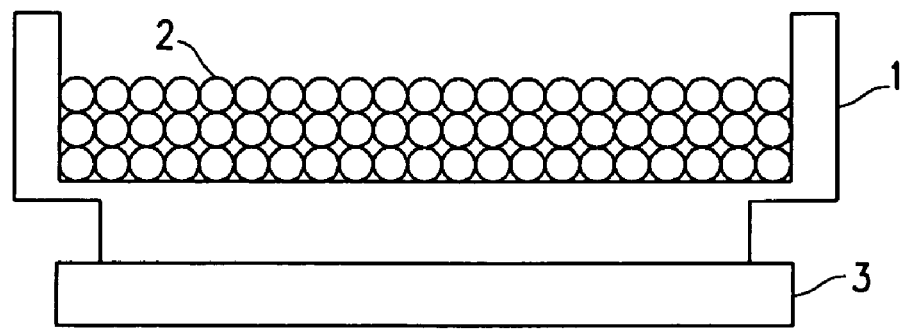
FIGS. 2(A) and 2(B) show a typical packing state of balls packed in a ball supply section of the ball mounting apparatus shown in FIG. 1.
Figure 2B:
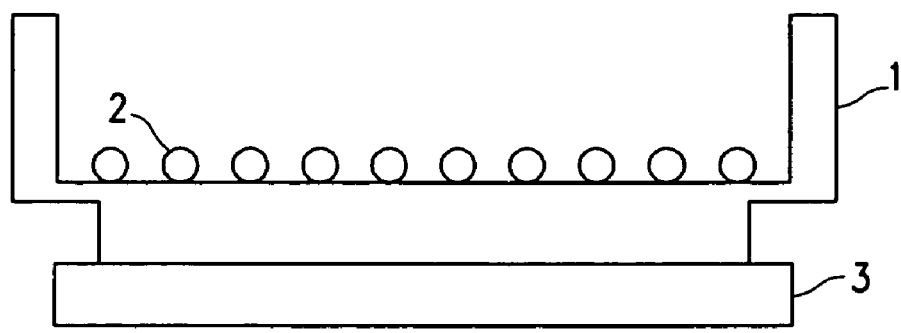

FIGS. 2(A) and 2(B) illustrate typical packing states for the balls 2. In the case of FIG. 2(A), in which the balls 2 are piled several layers deep in the ball supply section 1, even when the balls 2 are vibrated by the vibrator 3, the balls 2 simply rock, but do not for the most part jump upward, because the balls 2 interfere with each other. The proper functioning of this mechanism requires that the balls 2 jump upward in substantial numbers; if the balls do not jump upward they will not be captured by the suction applied by the head 4. If a sufficient ball capture rate cannot be provided, the head bottom 5 must be urged downward into the group of vibrating balls. This raises the possibility that the balls will be deformed by pressure applied by the head bottom 5.

On the other hand, in the case of FIG. 2(B), in which the balls 2 lie sparsely in a single layer in the ball supply section 1, the balls skip upward, impelled by the vibrator 3. In order to for the vibrator 3 to urge sufficient numbers of the balls 2 to skip upward, it is preferable to control the amount of the balls 2 in the supply section 1 to ensure that the balls 2 lie in a single sparse layer on a bottom of the ball supply section 1, that is, the container.

Even when the balls lie in a single layer, the balls do not skip upward high enough if the number of balls is too large, because the balls 2 interfere with each other. When the number of balls 2 is small, on the other hand, the balls 2 do skip upward, but it takes a long time to capture the balls 2 at all of the suction holes 25 provided on the head bottom 5.

In this embodiment, it is most preferred that the balls 2 occupy about 50% of the bottom area of the ball supply section 1. It is preferred that the area the balls occupy is 5 to 80% of the bottom of the ball supply section 1, and it is more preferred that it is 20 to 70%.

When skipping balls 2 are sucked up to the head 4, the head bottom 5 is moved so that the skipping balls 2 that come near the suction holes 25 provided on the head bottom 5 are sucked into and adhere to the holes. It is not necessary, in this condition, to counterbalance the head weight, because the balls 2 are not pressed on by the head bottom 5. The head 4 can suck up the balls 2 while the head 4 is clamped in order to prevent vibration.

A mechanism that blows air from under the balls 2 can also agitate the balls 2 in the same way as the vibrator 3. When such a mechanism is used, if the head 4 is not lowered into the group of balls 2, it takes a long time to suck up the balls 2 and there can be suction holes 25 which can not suck up the balls 2, because the height to which the balls skip is very low.

If the head bottom 5 is lowered into a group of the balls 2 in a clamped condition, the balls 2 are forced into and stick firmly to the suction holes 25 provided on the head bottom 5. Therefore, when the balls 2 are mounted on the workpiece 12, some of the balls 2 may not be mounted successfully onto the workpiece 12, but may instead remain on the head 4. So, when lowering the head bottom 5 into the group of the balls 2, the head weight should be counterbalanced. Thus, whether it is necessary or not to counterbalance the head weight is determined by a condition in which the balls 2 skip as the balls 2 are sucked up into contact with the head 4.

The workpiece 12 is sent onto the workpiece's XYZΘ table 13 from a magazine by a loader (not shown). The workpiece's XYZΘ table 13 includes an X-table that acts in the X-direction in a plane, a Y-table that acts in the Y-direction in a plane, a Z-table that acts upward and downward, and a Θ-table that provides for rotation. The Θ-table is on the upper stage, with holding table 23 for fixing the workpiece 12 attached on the Θ-table. In the present invention, the positioning mechanism for the workpiece 12 includes the workpiece's XYZΘ table 13 and the holding table 23.

Figure 3A:
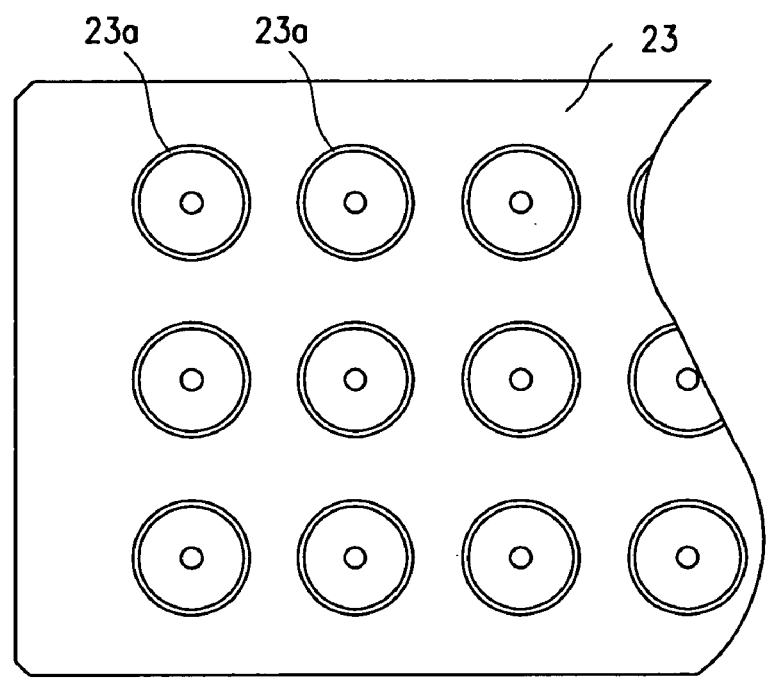
FIGS. 3(A) and 3(B) show a holding table of the ball mounting apparatus shown in FIG. 1.
Figure 3B:
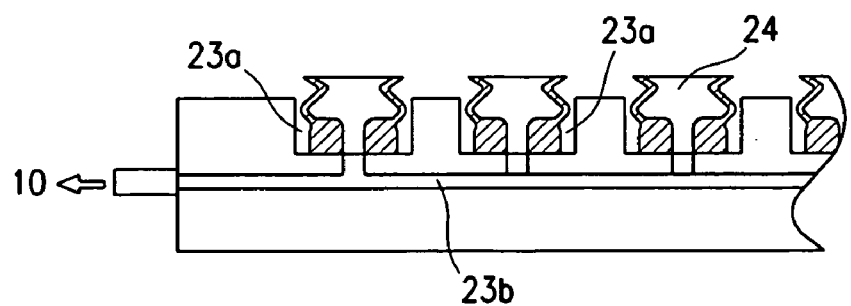

FIGS. 3(A) and 3(B) show the holding table 23. FIG. 3(A) is a plan view and FIG. 3(B) is a cross-sectional view. A plurality of holes 23a are provided in the holding table 23 to receive suction pads 24 and tubes 23b for connecting the holes 23a to a vacuum pump 10. The workpiece 12, which is transferred onto the holding table 23, is held by the suction pads so that any curvature or bowing of the workpiece 12 is leveled. Bellows-shaped suction pads 24 are superior to plain-shaped suction pads for reducing bowing in the workpiece 12, because bellows-shaped suction pads 24 deform more along the suction axis. The bellows-shaped suction pads 24 are disposed in the holding table 23 so that each tip of the pads 24 lies 1 mm above the holding table 23.

The tip of each of the bellows-shaped suction pads 24 preferably protrudes above the holding table 23 in the range from 0.2 mm to 5 mm, but that preferred dimension depends on the degree of bowing of the workpiece 12. When an area of the workpiece 12 is greater than or equal to 5 cm×10 cm and its thickness is thinner than or equal to 0.1 cm, ball mounting errors increase rapidly in the step of mounting the balls. The bellows-shaped suction pads 24 are effective with large size work pieces such as that described above.

In order to mount the balls 2 sucked up to the head 4 on predetermined places (for example, electrodes 29 in FIG. 8) of the workpiece 12, it is desirable to align the head 4 and the workpiece 12. Alignment of the head 4 and the workpiece 12 is performed by recognizing predetermined registration marks, calculating position data for the predetermined marks, and then driving the XYZθ table 7 for the head and the XYZΘ table 13 for the workpiece. Position data of marks input by hand and image data captured by a scanner in advance are used as reference data so as to determine whether the image data match the predetermined marks or not. When the head 4 is moved a long distance, a drive unit different from the XYZθ table 7 for the head is used. That is, an X-direction drive unit 22 is employed in the X-direction and a Z-direction drive unit 9 is employed in the Z-direction. Each of these drive units includes a servomotor with an absolute encoder and a ball screw assembly. Position data in programs for moving the head 4 are input through a teaching method.

Methods for feeding flux, which is necessary for soldering, include: a printing method, in which the flux is printed on the predetermined positions of the workpiece 12; a transferring method, in which the flux applied on the tips of pins and transferred to the predetermined positions on the workpiece 12; and a dipping method, in which lower parts of the balls 2 which are held by the head 4 are dipped into the flux and then the balls 2 with the flux are mounted onto the workpiece 12. This invention may use any of the above-mentioned flux feeding methods. Also, in this embodiment, a flux feeding mechanism 26 is arranged near the ball supply section 1.

Figure 4:
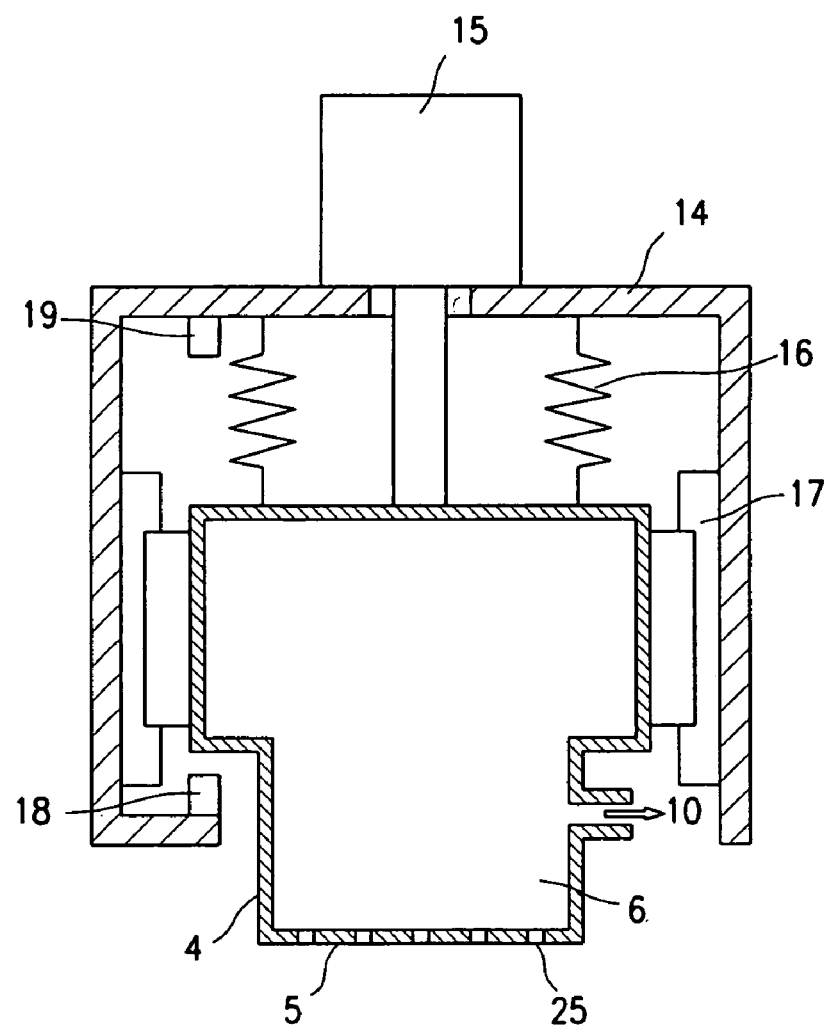
FIG. 4 shows a second embodiment related to structures of the head and peripheral devices that are used on the ball mounting apparatus shown in FIG. 1, in a cross-sectional view showing a counterbalance mechanism and a damping device for the head.

FIG. 4 is a second embodiment in relation to a peripheral portion of the head 4 for a ball mounting apparatus of the present invention. This figure is a cross-sectional view showing a mechanism in which a total of the head weight and a pressing force applied by a cylinder 15 counterbalances with a force applied by a spring member 16, and which includes a clamping device for clamping the head 4 to the lower stop 18 by forcing the head 4 downward with the cylinder 15. This head 4, moreover, has nearly the same structure as the head 4 of the first embodiment shown in FIG. 1, but the two embodiments are slightly different in the position of the cylinder 15, the structure of the case 14, etc. Numeral 4 denotes a head. Numeral 5 denotes a head bottom. Numeral 14 denotes a case. The cylinder 15, the spring member 16, the slider 17, the lower stop 18 and the upper stop 19 are attached to the case 15. The head 4 is fixed on one end of the cylinder 15. The spring member 16 is selected to provide a spring force which is able to lift the head 4 upward. The head 4 and the spring member 16 are arranged in the case 14.

FIG. 4 shows a state in which the total of the head weight and the pressing force of the cylinder 15 counterbalances the force applied by the spring member 16. Because this counterbalance mechanism keeps counterbalance with the force of the spring member 16, the balanced condition is easily restored by the spring member 16, which expands and contracts to restore the counter balance in any case in which the balanced condition is disturbed.

It is most preferable that that the spring force applied by the spring member 16 be sufficient to lift the head against the upper stop 19 when the pressure applied by the cylinder 15 is zero. It is also preferable that the spring member be capable of applying sufficient force to counterbalance the pressure of the cylinder 15, so that the effective force on the head 4 is zero when the head 4 is held at a position between the lower stop 18 and the upper stop 19. The force of the spring member may be such that the head 4 remains on the lower stop 18 when the pressure applied by the cylinder is zero. In this case, the spring member may apply a force that reduces the force of the head against the lower stop 18 to less than 1 Kgf. If the force that presses the head 4 against the lower stop 18 is in excess of 1 Kgf in spite of being reduced by the force of the spring member 16, the balls 2 will stick to the suction holes 25 provided at the head bottom 5. The balls 2 will then not transfer completely onto the workpiece 12, some of the balls instead remaining stuck to the head.

When a workpiece 12 is changed to one having a different configuration, the head 4 is changed so that the head 4 will still match the new workpiece. If the head 4 and the spring member 16 are changed together, it takes a long time to change over to another model. The need to change over the spring member 16 every time the head is changed can be eliminated if the spring member is selected of that its force is such that the head can be lifted above the upper stop 19 with the spring force counterbalancing the head weight, by adjusting the pressure applied by the cylinder 15 alone. When this is the case, the spring member 16 is able to correspond to every kind of the head 4, so that the spring member 16 can reduce model changing time. Moreover, easily changing over (so-called one touch exchange) of the head 4 becomes possible.

Figure 5:
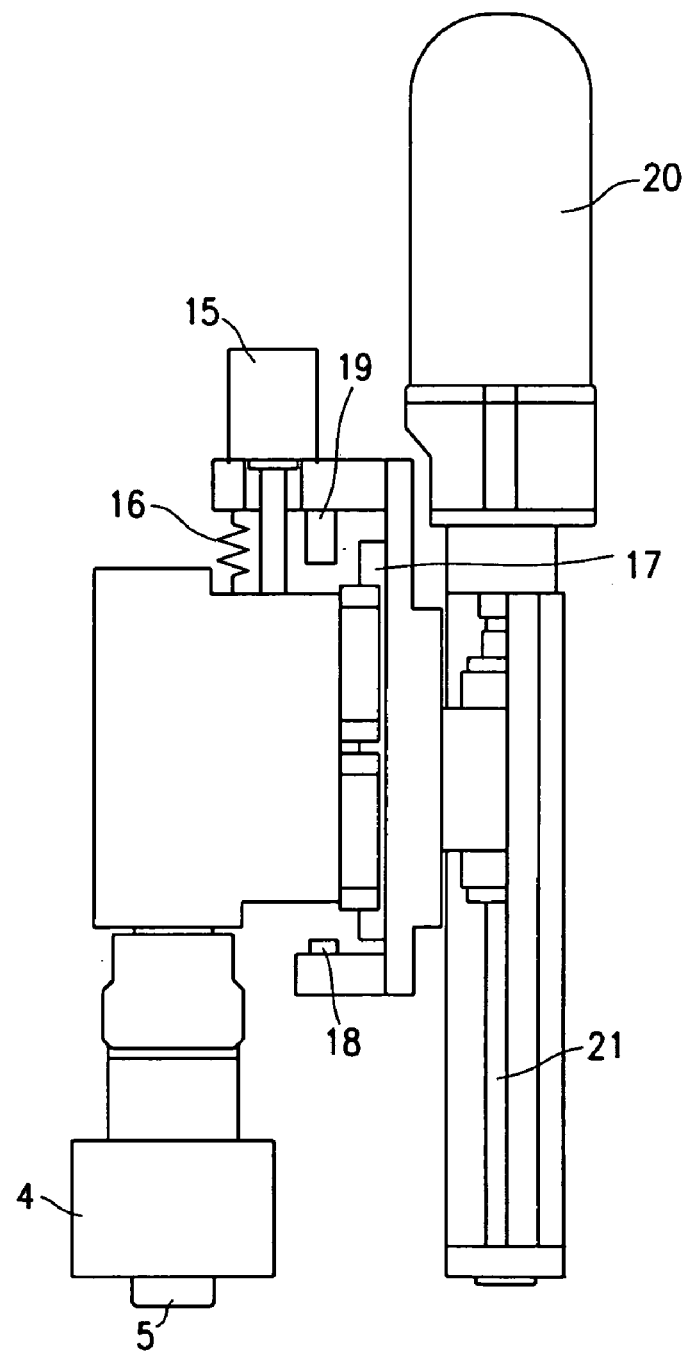
FIG. 5 shows a third embodiment according to structures of the head and peripheral devices which are used on the ball mounting apparatus shown in FIG. 1, in a side elevation showing a mechanism portion including a counterbalancing mechanism, a clamping device and a moving mechanism for the head.

FIG. 5 is a third embodiment in relation to the head 4 and its drive unit for the ball mounting apparatus of the present invention. This figure provides a side view showing a mechanism which includes a counterbalance mechanism for the head 4, a clamping device for the head 4, and a mechanism section including the moving mechanism for the head 4. A mechanism for counterbalancing the head weight is an improvement of the counterbalance mechanism shown in the first and the second embodiment. Numeral 4 denotes a head having cavity 6. Numeral 5 denotes a head bottom being disposed the suction holes 25. Numeral 15 denotes a cylinder. Numeral 16 denotes a spring member. Numeral 17 denotes a slider. Numeral 18 denotes a lower positioning. Numeral 19 denotes an upper positioning. Numeral 20 denotes a motor. Numeral 21 denotes a ball screw assembly. This mechanism is a structure devised to easily assemble and handle the apparatus and to eliminate the case 14 that covers the head 4 and the spring member 16 in the second embodiment described above.

Figure 6:
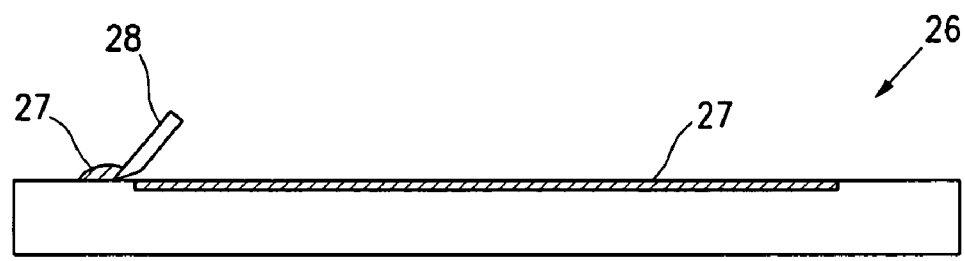
FIG. 6 is a cross-sectional view showing a flux supply mechanism for the ball mounting apparatus shown in FIG. 1.

FIG. 5 shows a state in which the total of the weight of head 4 and the pressure applied by the cylinder 15 counterbalances the force applied by the spring member 16. The spring member 16 provides the same characteristics as described in the first and second embodiments. The moving mechanism for the head 4 is composed of the XYZθ table 7 for the head, the base 8, the X-direction drive unit and the Z-direction drive unit like the first and second embodiments FIG. 6 shows one example of a flux feeding mechanism 26 for applying flux 27 to the balls sucked up to the head 4 and for supplying the flux. The flux feeding mechanism 26 has a shallow depression for storing the flux 27. The depression is larger in area than the head bottom 5, and the depth of the depression is matched with an amount of the flux 27 which should be applied to the balls 2. The flux 27 is formed into a flux layer with a plane surface by a horizontally moving blade 28.

Figure 7:
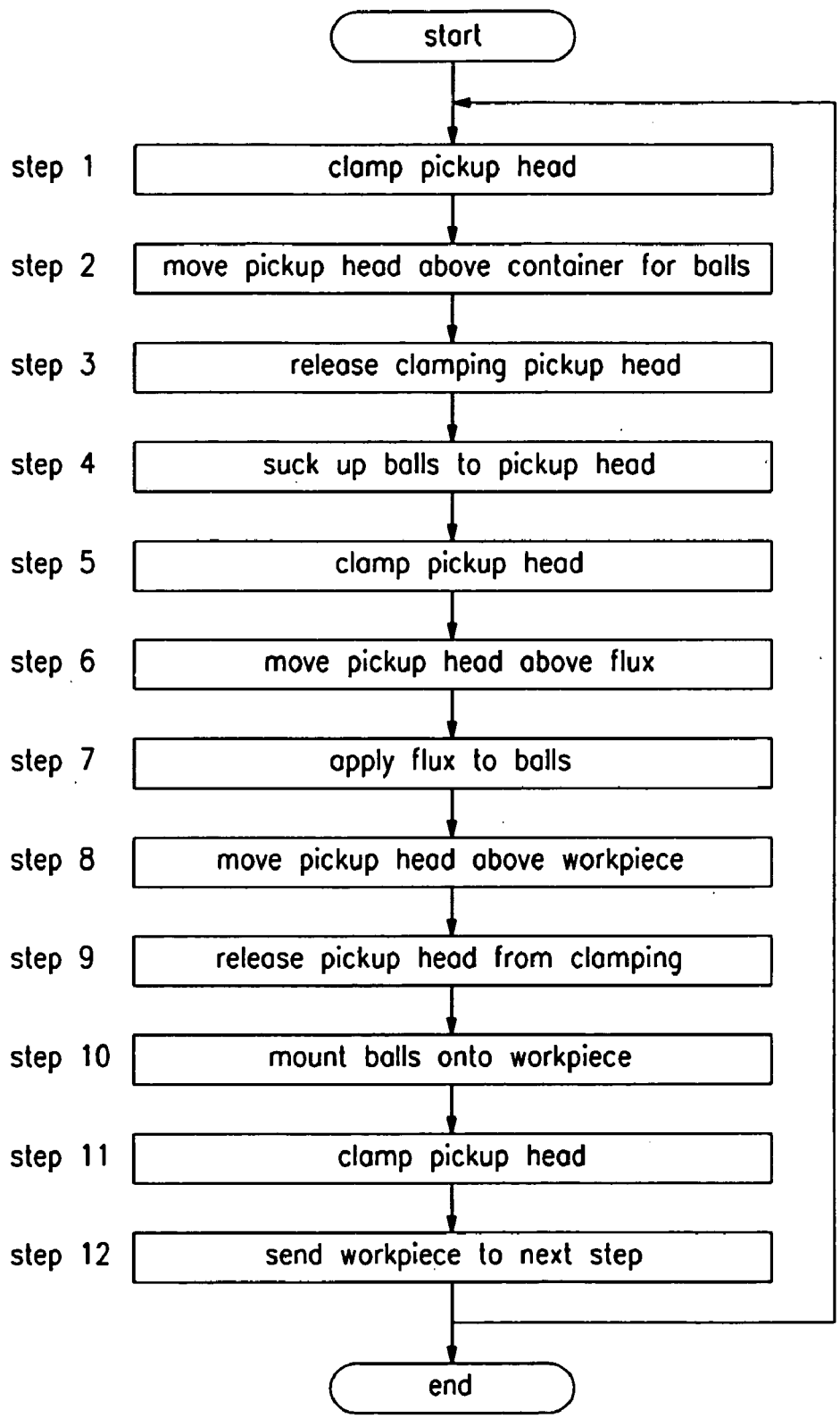
FIG. 7 is a flowchart showing a ball mounting method according to an embodiment of the present invention, performed by using the ball mounting apparatus shown in FIGS. 1 to 6.

FIG. 7 shows a ball mounting method according to an embodiment of the present invention and a flowchart relating to a first method that uses the ball mounting apparatus shown in FIGS. 1–6. The first embodiment of the ball mounting method includes the steps of applying flux 27 to the lower part of balls 2 and mounting the balls 2 applied with the flux 27 on the workpiece 12, after the balls are sucked up and held by the head.

In step 1, the head 4 is urged downward by the cylinder 15 and damped to the lower stop 18 to prevent vibration while the head 4 is moved and when the head 4 is stopped. The clamping force is set at 7 Kgf. In step 2, the head 4 is lowered near to the container of the ball supply section 1 in which several layers of the balls 2 are piled. The head bottom 5 is not moved into the balls but is instead kept 1 cm above the top face of the balls. In step 3, the clamping force applied by the cylinder 15 to the head 4 is reduced, and the head 4 is thus released from the clamped condition, with the head weight counterbalanced by the force of the spring member 16. Further, vacuum is applied to the cavity 6 of the head 4 by the vacuum pump 10, so that the head 4 is able to suck up the balls.

In step 4, which is a step of sucking up the balls 2, the balls 2 are sucked up to the head 4 by slowly lowering the head bottom 5 into the group of the balls being floated by the vibrator 3. After sucking up the balls 2 for 3 seconds, the head 4 is raised 1 cm. The balls 2 may be constantly floated by the vibrator 3, but in order to prevent deformation and aggregation of the balls 2, it is more desirable to begin vibrating the balls 5 seconds before beginning sucking up the balls 2.

In step 5, the head 4 is pressed downward by the cylinder 15 against the lower stop 18, and clamped with a force of 7 Kgf so as to prevent vibration of the head 4 while the head 4 is moved. In step 6, after the head 4 is raised upward at the speed of 10 cm per second, and then moved in a horizontal direction to a position above the flux feeding mechanism 26 at the speed of 30 cm per second, the head 4 is moved near the flux layer formed to a predetermined thickness at the speed of 10 cm per second.

In step 7, when the flux layer in the container of the flux feeding mechanism 26 is deeper than a depth to which the balls 2 are dipped into the flux 27, the tips of the balls 2 held by the head 4 are dipped into the flux 27 and lower parts of the balls 2 are applied with the flux 27. Flux 27 adhering to the head bottom 5 would cause extra balls to adhere to the head bottom 5 in the step (step 4) of sucking up the balls 2 to the head 4. In order for the head bottom 5 not to touch the flux 27, Z-direction position control is practiced.

On the other hand, in the case where the flux layer is thinner and equal to the depth to which the balls 2 are dipped into the flux 27, after the head weight is counterbalanced substantially to zero, the head 4 is moved to the bottom of the flux layer. In this case, since the head weight is counterbalanced substantially equal to zero, the balls 2 do not stick tightly into the suction holes 25 provided at the head bottom 5, so that extra balls do not occur in the step of mounting the balls 2 onto the workpiece 12.

In step 8, the head 4 is raised upward in its clamped state, moved above the workpiece 12, and then lowered to 0.5 cm above the workpiece 12. The speed of movement is the same as that of step 6. In step 9, when moving, the head 4 is unclamped in the manner the same as that of the step 3 to prevent excessive force being applied to the balls 2. In step 10, the head 4 is lowered slowly until the flux 27 applied on the lower parts of the balls 2 touches to the workpiece 12.

Next, the pressure inside the cavity 6 in the head 4 is returned back to atmospheric pressure and the balls are mounted on the workpiece 12 with the help of the self-weight of the ball 2 and an adhesive strength of the flux 27. Then, the head 4 is raised slowly 1 cm and the ball mounting process is completed. In step 11, the head 4 is clamped again and returned to step 2. In step 12, the workpiece 12 is sent to a process that follows step 11, such as an inspection, a reflow soldering or a cure process.

When the balls 2 lie sparsely in a single layer in the ball supply section 1, the balls 2 are largely floated upward by the vibrator 3. Therefore, it is unnecessary to cancel the clamped condition of the head 4 when sucking up the balls 2, because there is no possibility that the head 4 will press against the balls 2. In this case, step 3 and step 5 may be omitted. Since a floating distance of the balls is short in the case where the balls 2 are floated by gas, once the head weight is counterbalanced, the head bottom 5 is moved into the group of the balls 2 to capture the balls 2.

In the case where the balls 2 are smaller than or equal to 300 microns in diameter, the balls 2 are gathered and agglomerated under the head 4 through streams of air which are absorbed through the suction holes 25 provided at the head 4. If the balls 2 are agglomerated, the balls 2 can not be picked up reliably. In this case, the head 4 is raised upward so that picking up of the balls is stopped, and once agglomeration of the balls 2 is loosed by vibration, the head 4 is lowered to resume sucking up the balls 2 again. In the case where the balls 2 are small in diameter and numerous balls are mounted, it may be necessary to repeat the above process several times.

Alternatively, as the balls are sucked up, the suction pressure may be momentarily weakened, not so much that the balls already picked up are dropped, but enough so that the agglomerated balls are dispersed, after which the balls are sucked up again. In this manner, the same performance can be obtained.

In the step 7 where the flux 27 is applied to the lower part of the balls 2, each ball 2 is dipped in the flux 27 to a depth equal to $\frac{1}{10}$ to $\frac{3}{5}$ of the diameter of each ball 2. It is more preferable to be dipped in the flux 27 $\frac{1}{5}$ to $\frac{1}{2}$ of the diameter. The amount of the flux 27 coated on the ball 2 depends on a depth at which the ball 2 is dipped into the flux 27. Though the depth of dipping the ball 2 into the flux 27 deviates only 5 μm in the case in which the ball 2 is 100 μm in diameter, the amount of the flux 27 coated on the ball 2 fluctuates approximately 20%.

A reference position in the Z-direction is determined by using a level gauge, but this may change as temperature changes in operation. If compensations for the position in the Z-direction are not frequently carried out, positioning errors increase. In the case where the balls 2 which are smaller than or equal to 200 microns in diameter are mounted on a curved workpiece, pickup errors increase, if the compensations are not carried out frequently.

Figure 8A:
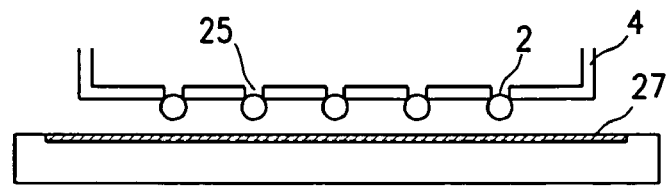
FIGS. 8(A)–8(F) schematically show the steps of applying the flux to the balls and mounting the balls to which this flux is applied onto the workpiece.
Figure 8B:
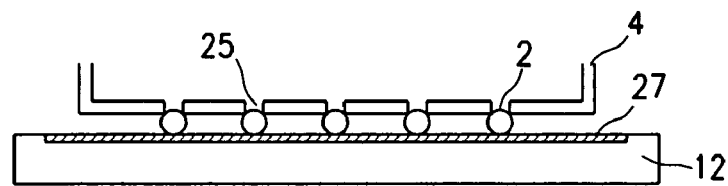
Figure 8C:
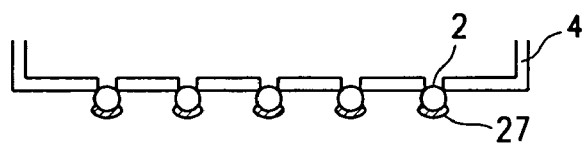
Figure 8D:
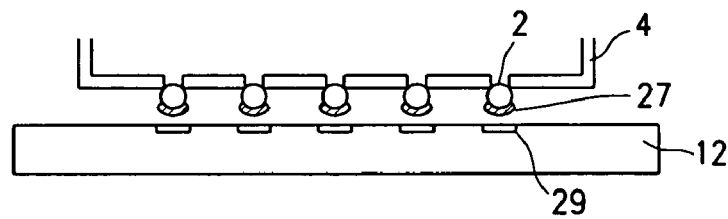
Figure 8E:
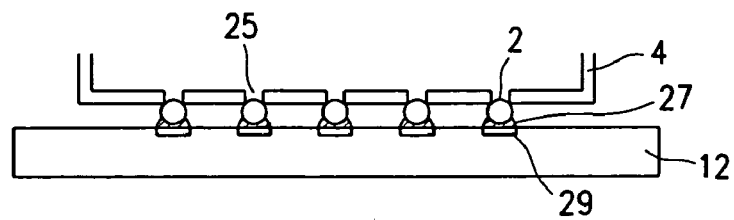
Figure 8F:
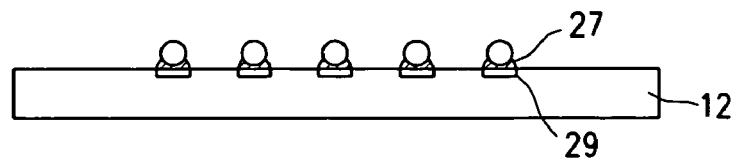

FIGS. 8(A)–8(F) illustrate schematically a process of mounting the balls 2 onto electrodes 29 on the workpiece 12 after the balls 2 are dipped into the layer of flux 27 and the flux 27 is applied to the balls 2. FIG. 8(A) shows a state in which the head 4 is moved above the depression filled with the flux 27 which is formed to the thickness corresponding to the amount which should be applied to the ball 2. FIG. 8(B) shows a state in which the balls 2 held by the counter-balanced head 4 are lowered to a bottom of the flux layer. FIG. 8(C) shows a state in which the head 4 is raised after the flux 27 is applied to the balls 2. FIG. 8(D) shows a state in which the head 4 is moved above the workpiece 12. FIG. 8(E) shows a state in which the counter-balanced head 4 is lowered further, contacting the flux 27 with the pads 29. FIG. 8(F) shows a state in which the balls 2 applied with the flux 27 are mounted onto the electrodes 29 provided on the workpiece 12.

To precisely control the amount of flux 27 applied to the balls 2, the following method is preferable. First, a flux layer is formed by a blade in a thickness which corresponds to an amount to be applied, and then the head 4 is counterbalanced so that the effective head weight is substantially equal to zero. Next, once the head 4 is lowered until each tip of the balls reaches the bottom face of the flux layer (the bottom of the depression that holds the flux) which is formed to a predetermined depth, the head 4 is raised slowly. Since the head 4 has an effective weight of zero because the head weight is substantially counterbalanced, the head 4 does not apply substantially any load to each ball 2, even if the head 4 makes each tip of the balls 2 lower still further after each tip of the balls 2 reaches the lower face of the flux layer and contacts with the bottom of the depression. In other words, each of the balls 2 does not stick firmly into the suction holes 25 disposed on the head bottom 4.

In this method, the amount of the flux 27 applied on each ball 2 held by the head 4 does not depend on a depth to which each of the balls 2 is pushed into the flux 27, but instead by the thickness of the flux layer. So, the smaller each of the balls 2 is in diameter, the more effective this method is. This method is especially effective when each of the balls 2 is smaller then or equal to 500 microns in diameter; and still more effective when it is smaller than or equal to 300 microns in diameter. It is preferable that the thickness of the flux layer formed in the flux supply mechanism 26 is $\frac{1}{10}$ to $\frac{3}{5}$ of the diameter of each of the balls 2. It is more preferable that it is $\frac{1}{5}$ to $\frac{1}{2}$ of the diameter of each of the balls 2.

Figure 9:
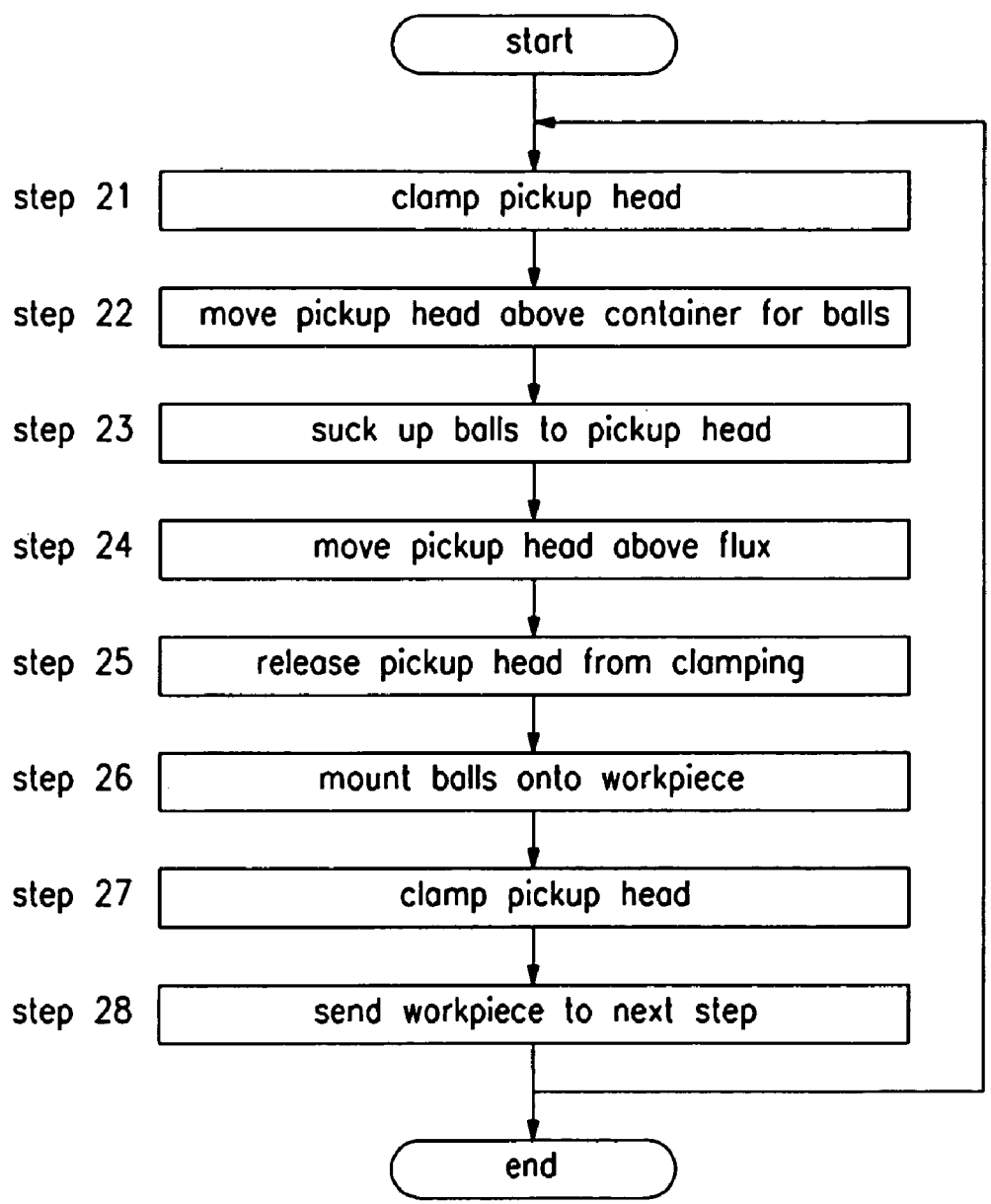
FIG. 9 is a flowchart showing a ball mounting method according to another embodiment of the present invention, is carried out using the ball mounting apparatus shown in FIGS. 1 to 6.

Another method provides a process for mounting the balls 2 held by the head 4 on the workpiece 12 on which the flux 27 has been applied to the predetermined places by a printing apparatus. FIG. 9 shows a flowchart of this second embodiment. In step 21, the head 4 is clamped to the lower stop 18. In step 22, the head 4 is moved above the ball supply section 1. The ball supply section 1 is supplied with balls 2 that occupy approximately 50% of the ball supply section 1 by area. The step 3 in FIG. 7 according to the first embodiment is omitted. In step 23, the head 4 is lowered into the range where the balls 2 are skipped and floated by the vibrator 3, so that the balls can hit the head bottom 5 and be sucked up against the head bottom 5 by vacuum (corresponding to the step 4 of the first embodiment). In step 24, the head 4 is moved 1 cm above the workpiece 12 on which the flux 27 is printed on the predetermined positions. In step 25, the head 4 is released from clamping. In step 26, after the head 4 is lowered slowly so that the balls 2 held by the head 4 are dipped into the flux 27 printed on the workpiece 12, the vacuum inside the cavity 6 is returned to ambient pressure and the head 4 is raised slowly to transfer the balls 2 onto the workpiece 12 with the help of the self-weight of the ball 2 and adhesion of the flux 27. The head 4 is then raised upward 1 cm in distance. Through this process, the balls 2 held by the head 4 are transferred onto the workpiece 12 with the help of adhesion of the flux.

Figure 10A:
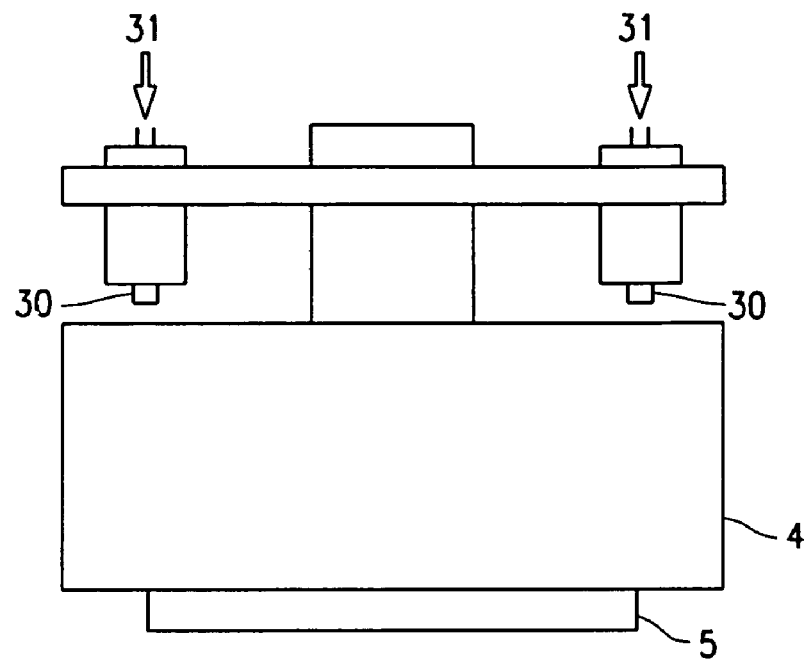
FIGS. 10(A) and 10(B) show a head portion in which the single-acting cylinder is attached to the head of the ball mounting apparatus shown in embodiments of the present invention.
Figure 10B:
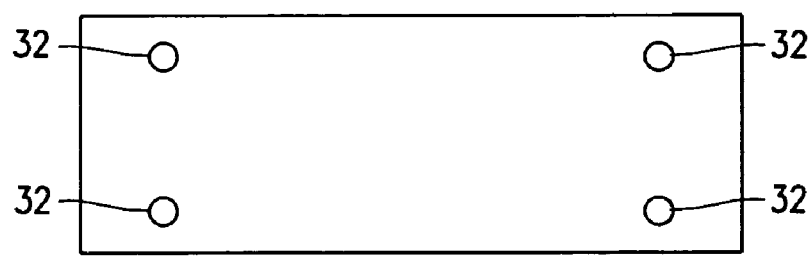

While the head 4 is raised or after the head 4 is raised, vibrations are imparted to the clamped head 4 so that the balls 2 do not remain on the head bottom 5. The vibrations are generated by striking the head 4 with a hammer. The hammer may strike only a single time, but the number of strikes can be increased up to five times if the balls 2 tend to remain. A striking force is weaker when the head 4 is not clamped than when the head is clamped. This method in which the remaining balls are dropped by striking the head 4 with the hammer is also effective in the first embodiment according to the ball mounting method of the present invention FIG. 10(A) shows a front view of the head 4 a single-acting cylinder 30 attached and FIG. 10(B) shows the positions where the head 4 is struck by the single-acting cylinder 30. A spring is provided inside the single-acting cylinder 30. The single-acting cylinder 30 which is pushed out by air 31 is retrieved to a home position by the force of a spring when the air pressure is reduced to Zero. Numeral 4 denotes a head, numeral 30 denotes a single-acting cylinder, numeral 31 denotes air for driving the cylinder, and numeral 32 denotes positions where the single-acting cylinder strikes an upper face of the head 4. Striking edge portions of the head is preferable to striking a central portion of the head 4. In the present invention, the hammer may be the single-acting cylinder 30, an electromagnetic hammer, and so on. The electromagnetic hammer is a conventional one which is composed of a coil, a spring member, a hammer, a magnetic circuit and electrical circuits. As for other vibration methods, except the hammer, to prevent the balls from remaining on the head 4, there is a method imparting vibrations with an ultrasonic vibrator. But, the method using the ultrasonic vibrator is inferior to one using the hammer, because vibration energy imparted one time by the ultrasonic vibrator is smaller than by the hammer.

Referring back to FIG. 9, in step 27, the head 4 is clamped to the lower stop 18. After the step 27, the head 4 returns to the step 22. In step 28, the workpiece 12 on which the balls 2 have been mounted is transferred to a next process.

In the above-described two embodiments, when the head 4 does not have any balls adhered to it, there is no risk of the balls 2 dropping from the head 4 while the head is moved. A travel speed of the head 4 can be faster when no balls are present than when they are. In order to prevent vibration of the head 4 when the head 4 is moved at the speed of 5 to 200 cm per second, it is preferred that the head 4 is clamped to the lower stop 18 with a force above 2 Kgf applied by the cylinder 15. In the case of moving the head 4 at the speed of 5 cm per second, it is possible to prevent the head 4 from vibration by urging the head 4 against the lower stop 18 at 4 Kgf. In the case where the head 4 slowly stops, the head 4 can be also prevented from vibration by pressuring the head 4 to the lower stop 18 at 2 Kgf.

From the point of view of preventing vibration, an upper limit of pressure does not exist; but, considering an ability of the cylinder 15 and stiffness of the apparatus, the upper limit of pressure is preferably about 200 Kgf. It is more preferable that it is smaller than or equal to 30 Kgf Though the embodiments show the mechanisms which pressurize the head 4 to the lower stop 18, positions and devices for pressurizing the head 4 are not limited only to these, because a purpose of the present invention is to provide methods for clamping the head 4 so as not to cause vibration. Instead of methods for pressurizing the head 4 itself to the lower stop 18, methods that urge an attachment of the head 4 to the lower stop 18 may also be used. Moreover, the head 4 may, mechanically or electromagnetically, be clamped in the lateral direction by conventional methods.

In case of stopping the head 4 impulsively, vibration occurs even if the clamping force is strong, hence stopping the head 4 impulsively is not preferable. That is to say, it is preferable that the speed of the head 4 is reduced gradually. Acceleration and deceleration are programmed in that do not cause vibration.

In each embodiment of the present invention, since the head weight largely changes in accordance with production types, the spring member 16 which counterbalances with the head weight is designed to be rather big and to have a spring constant and length which can urge the head 4 to the upper stop 19 when the pressure of the cylinder 15 is zero by atmospheric pressure. In this manner, the spring member 16 may be designed to commonly be able to be used.

In each embodiment of the present invention, it is preferable that the balls 2 are conductive balls made of solid metals or insulative balls coated with surfaces of conductive materials. The conductive balls made of the solid metals may be solder, gold, silver, copper, nickel balls and so on. The conductive balls made of the insulative balls coated with conductive materials may be plastic, glass, quartz or alumina balls coated with solder, gold, silver, copper, palladium, tin, or nickel. Compositions of the solder are a eutectic composition, high melting point solder compositions, low melting point solder compositions, lead free solder compositions, etc. The metals may be both mono metal and alloy.

In each embodiment of the present invention, it is suitable, in the case where the ball 2 is made of the solder, that the flux 27 may be composed of a base composition that consists of rosin added to amine for an activator. In the case where the ball 2 is made of gold, silver, copper, nickel, etc., it is suitable that the flux 27 may be composed of conductive adhesives such as solder cream, silver paste, gold paste and so on, because these metals do not melt to act as solder. In the present invention, the conductive adhesives include silver paste, gold paste, nickel paste, etc., and also solder cream.

In each embodiment of the present invention, both an air cylinder and an oil cylinder are suitable for the cylinder 15, but the air cylinder is preferable to the oil cylinder.

In each embodiment of the present invention, the head 4 clamped to the lower stop 18 by the cylinder 15 separates and moves upward from the lower stop 18 as the force of the spring member 16 comes to exceed the weakening pressure of the cylinder 15. Just before the head 4 rises from the lower stop 18, the head weight is counterbalanced effectively to zero. If the pressure of the cylinder 15 is decreased still further, the head rises upward while maintaining the condition in which the head weight is effectively zero. The spring member's energized force in the upward direction decreases as the head 4 rises.

The head 4 comes to rest at a point where a total of the head weight and the pressure of the cylinder 15 balances with the force of the spring member 16. Since the force of the spring member 16 is a function of the length of the spring member 16, the spring member 16 shortens slightly to maintain balance as the pressure of the cylinder 15 decreases slightly. In the opposite case, where the pressure of the cylinder 15 increases slightly, the spring member 16 elongates slightly in order to maintain balance. Therefore, the head position (Z direction) in the condition in which the weight of the head 4 is counterbalanced is a function of the self-weight of the head 4, the force of the spring member 16 and the pressure of the cylinder 15. When the relationship between these three elements changes or some disturbance occurs, the head position (Z direction) moves, but less in comparison with conventional cases.

Although such is generally the case with the preferred embodiments described above, the head weight need not be counterbalanced precisely to zero in every embodiment of the present invention. That is to say, if a deviation of the counterbalance for the head weight is less than 1 Kgf, practical problems rarely happen. It is more preferable that such deviations are maintained at less than 100 gf. In this case, the head 4 is held on the lower stop 18 and the head 4 can be accurately positioned, even in the condition in which the head weight is counterbalanced substantially to zero (the range in which the balls do not stick tightly to the suction holes 25). In the case where the deviation of the counterbalance is less than 100 gf, a force acting on one ball 2, in the head 4 which has 5,000 suction holes, averages 0.02 gf, so there is no chance for the balls to stick firmly to the suction holes 25. This load is less than an impulsive load which is applied when the balls 2 are sucked up to the suction holes 25 by vacuum.

The energized force generating device which lifts the head 4 upward may be another spring such as a plate spring instead of the spring member 16 which is a coiled spring, rubber, or elastic materials made of synthetic resins and others instead of the spring. Further, it is suitable, instead of pulling and lifting the head 4 by the spring member 16, that the spring which is attached under the head 4 may be designed to push and lift the head 4 upward.

The present invention is suitable to fix circuit components, such as ICs and so on, to a substrate, and further for use as an apparatus which mounts resin balls to predetermined positions and a section of an apparatus which assembles balls for a ball bearing to a bearing. Moreover, the ball 2 is described as sphere, but shapes of the ball 2 may be elliptic, cylindrical, and so on.

The present invention has the following advantageous effects. It is possible to avoid the balls which were stuck to the head and vibration occurred to the head by providing both a spring member energizing the head upward and a clamping device, for example, one composed of a cylinder and a lower stop. Consequently, the present invention can greatly contribute toward industrial developments of the ball mounting apparatus which is built in a counterbalance mechanism. Further, counterbalancing the head weight can be simply carried out by adjusting the clamping device, for example, adjusting pressure of the cylinder, with the help of a spring providing a force which is able to lift the head above the lower stop. The clamping device which is composed of the cylinder and the lower stop is able to accurately position the head (in the Z direction). It is possible to use a curved workpiece, because the curved workpiece is straightened flatter by fixing the workpiece to a holding table by using bellows-shaped suction pads.

Furthermore, a ball mounting method in which the balls do not stick and the head does not vibrate is able to be put into practical use by a method for clamping the head when the head is moved and releasing a clamping force when the balls are mounted on the workpiece. Even in the case where the head moves at the speed of 5 to 200 cm per second, the head can be prevented from vibration by clamping the head with a load of 2 to 30 Kgf. The suction efficiency of the head is improved, because the balls can be largely skipped upward by vibrating the balls in a sparsely scattered condition. The disadvantage that the balls aggregate can be overcome by intermittently sucking up the balls, and it is thus possible to efficiently suck up the balls to the head.

The predetermined amount of the flux can be precisely applied to each of the balls without sticking the balls to the suction holes by dipping the balls held by the head of which the weight is counterbalanced into the bottom of the flux formed to the predetermined thickness. It is possible to mount the conductive balls precisely coated with the predetermined amount of the conductive adhesive on the workpiece with the help of the step of applying the conductive adhesive to the conductive balls.

It has been found out that problems do not occur even if the counterbalance of the head weight deviates less than or equal to 1 Kgf. Consequently, the present invention has been able to greatly contribute toward wide developments of a counterbalance type ball mounting method which counterbalances the head weight by adopting the clamping force.

The balls remaining on the head can be dropped without big vibrations of the head, with the help of striking the head with a hammer after the steps of mounting the balls to the workpiece and then clamping the head.

It has been successfully demonstrated that the present invention prevents the balls from sticking to the suction holes when sucking up the balls or prevents from overload when mounting the balls on the workpiece, because the head weight is counterbalanced substantially to zero by appropriately adjusting with the force of the spring member which is provided in order to generate the force and the pressure of the cylinder which is provided in order to clamp the head.

It will be apparent to those skilled in the art that various modifications and variations can be made in the ball mounting method and apparatus of the present invention without departing from the spirit or scope of the inventions. Thus, it is intended that the present invention cover modifications and variations of this invention that come within the scope of the appended claims and their equivalents.

What is claimed is:

1. A ball mounting apparatus for mounting a plurality of balls held by a head on a workpiece, said ball mounting apparatus comprising:
    a positioning mechanism for positioning said workpiece;
    a ball supply device for supplying said balls;
    said head for holding said balls;
    an energized force generating device for lifting said head in an upward direction by a power that is larger than the weight of said head;
    a clamping device operable to clamp said head in a condition in which said energized force generating device stores an energized force, said clamping device comprising a cylinder, a clamping surface mounted to said head, and a rigid lower positioning stop configured for engagement with the head's clamping surface, wherein moving the head's clamping surface into engagement with the lower positioning stop clamps the head in a clamped position in which the energized force generating device stores an energized force;
    a moving mechanism for moving said head, wherein the clamping device is configured to clamp the head against the lower positioning stop with a sufficiently strong force that is larger than the head's upward force to prevent vibration of the head during movement of the head; and
    a mounting mechanism for mounting said balls on the workpiece, wherein the total of the weight of said head and a pressure applied by the cylinder counterbalances the energized force by said energized force generating device, and said head does not come in contact with the lower positioning stop and an upper positioning stop when said balls are mounted.

2. The ball mounting apparatus according to claim 1, wherein said energized force generating device is a spring member, and said spring member provides said energized force which is able to lift said head above the lower positioning stop constituting a part of said clamping device.

3. The ball mounting apparatus according to claim 1, wherein said clamping device further comprises a cylinder configured to apply a vertical positioning force to said head.

4. The ball mounting apparatus according to claim 1, wherein said workpiece is fixed on a holding table by bellows-shaped suction pads.

* * * * *